US 8,315,116 B2

(12) United States Patent
Kim et al.

(10) Patent No.: US 8,315,116 B2
(45) Date of Patent: Nov. 20, 2012

(54) REPAIR CIRCUIT AND REPAIR METHOD OF SEMICONDUCTOR MEMORY APPARATUS

(75) Inventors: Je Yoon Kim, Ichon-shi (KR); Ki Chang Kwean, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 190 days.

(21) Appl. No.: 12/840,177

(22) Filed: Jul. 20, 2010

(65) Prior Publication Data

US 2011/0267908 A1     Nov. 3, 2011

(30) Foreign Application Priority Data

Apr. 30, 2010 (KR) .................. 10-2010-0040661

(51) Int. Cl.
*G11C 29/00* (2006.01)
(52) U.S. Cl. ................... 365/200; 365/201
(58) Field of Classification Search .......... 365/200, 365/201, 189.07
See application file for complete search history.

(56) References Cited

U.S. PATENT DOCUMENTS

| 5,334,880 | A | 8/1994 | Abadeer et al. | |
| 5,418,738 | A | 5/1995 | Abadeer et al. | |
| 7,085,971 | B2 | 8/2006 | Barth, Jr. et al. | |
| 7,170,801 | B2 * | 1/2007 | Lee et al. | 365/200 |
| 7,509,543 | B2 | 3/2009 | Mohr et al. | |
| 7,768,847 | B2 * | 8/2010 | Ong et al. | 365/200 |
| 2003/0084386 | A1 | 5/2003 | Barth, Jr. et al. | |

FOREIGN PATENT DOCUMENTS

| JP | 2003-338192 | 11/2003 |
| KR | 10-0519897 | 9/2005 |

* cited by examiner

*Primary Examiner* — Vu Le
(74) *Attorney, Agent, or Firm* — William Park & Associates Ltd.

(57) ABSTRACT

A repair circuit of a semiconductor memory apparatus includes a repair address detection circuit that determines the occurrence of a failure in a memory block based on a plurality of test data signals outputted from the memory block, and stores an address corresponding to the memory block determined to have failed as a repair address, and an anti-fuse circuit that receives the repair address from the repair address detection circuit and electrically programs the repair address to store a programmed address.

21 Claims, 7 Drawing Sheets

REPAIR CIRCUIT AND REPAIR METHOD OF SEMICONDUCTOR MEMORY APPARATUS

CROSS-REFERENCES TO RELATED APPLICATION

The present application claims priority under 35 U.S.C. §119(a) to Korean Application No. 10-2010-0040661, filed on Apr. 30, 2010, in the Korean Intellectual Property Office, which is incorporated herein by reference in its entirety as if set forth in full.

BACKGROUND

1. Technical Field

The present invention relates to a semiconductor memory apparatus, and in particular, to a technology for repairing failures in a semiconductor memory apparatus.

2. Related Art

Semiconductor apparatuses, particularly semiconductor memory apparatuses, have fuse circuits for changing the internal configuration or programming the repair address. A set of fuses included in a fuse circuit store an address and specific configurations through fuse programming. The electrical connection resistive property of the fuse varies with changes in its electrical connection caused by the application of a laser beam or electrical stress. Specific information is programmed using such changes in the electrical connection state (short or open) of the fuse.

As a point of reference, a laser blowing-type fuse, in which the fuse link is cut by laser beams, is generally referred to as a physical fuse type. The laser beam irradiation is typically performed in a wafer state prior to the packaging of the semiconductor memory apparatus. In a packaged state, an electrical method is used rather than a physical method that uses laser beams. Fuses programmable in a packaged state are generally referred to as electrical fuses, meaning that such fuses may be programmed by changing their electrical connection state through the application of electrical stress. Such electrical fuses may be further categorized into anti-type fuses (hereinafter referred to as "anti-fuses"), which change from an open state to a short state, and blowing-type fuses, which change from a short state to an open state. These various types of fuses are selectively used based on consideration of various characteristics and the size of the semiconductor apparatus and semiconductor memory apparatus. In general, a fuse circuit includes a plurality of fuse sets, each of which may be programmed with a bit of specific address.

FIG. 1 is a configuration diagram illustrating a repair circuit of a typical semiconductor memory apparatus.

Referring to FIG. 1, the repair circuit of a semiconductor memory apparatus includes a plurality of fuse sets 10_0 to 10_N and a repair processing unit 20.

It is assumed that a specific repair address is programmed to each of the plurality of fuse sets 10_0 to 10_N. When an input address BXAR<2:11> is applied to the plurality of fuse sets 10_0 to 10_N, each fuse set outputs a plurality of hit signals HIT<0:9> by comparing the input address BXAR<2:11> with its repair address programmed in the fuse set, in response to the corresponding fuse set enable signal FSE0-FSEN.

The repair processing unit 20 replaces the memory block corresponding to the repair address with a redundancy memory block, based on the plurality of hit signals HIT<0:9> outputted from the plurality of fuse sets 10_0 to 10_N. The repair processing unit 20 includes a plurality of comparison sections 21_0 to 21_N and a repair determination section 22.

The memory block corresponding to the repair address is a memory block where a defect, such as a memory failure, has occurred in a memory read/write operation.

Since all of the comparison sections 21_0 to 21_N perform the same operation, the operation of the first comparison section 21_0 is representatively described. The first comparison section 21_0 outputs a first repair block selection signal HITB<0> by logically combining the plurality of hit signals HIT<0:9> outputted from the first fuse set 10_0. In general, the first comparison section 21_0 includes a logic unit that outputs the first repair block selection signal HITB<0> by performing a NAND operation on the plurality of hit signals HIT<0:9>. Accordingly, when all of the hit signals HIT<0:9> are outputted at a high level, the first repair block selection signal HITB<0> is activated to a low level. This means that the repair address stored in the first fuse set 10_0 is equal to the input address BXAR<2:11>.

The repair determination section 22 outputs repair determination signals HITSUM<0:N> representing whether or not a repair operation is needed, based on the repair block selection signals HITB<0:N> outputted from the plurality of comparison sections 21_0 to 21_N. At that time, assuming that the repair operation is performed on a word line basis, access to normal word lines is prohibited by a normal word line disable signal NWD outputted from the repair determination section 22, and redundancy word lines are driven by a specific repair determination signal HITSUM<i> and replace the normal word lines.

In order to perform the repair operation described above, repair addresses should be programmed into the fuse sets in advance. In general, a programming operation is performed by directly inputting repair addresses from the outside into the fuse sets. However, direct input of the repair addresses into the fuse sets from is the outside reduces the efficiency of the programming operation.

SUMMARY

In one embodiment of the present invention, a semiconductor memory apparatus includes a repair circuit, and the repair circuit comprises: a repair address detection circuit configured to determine an occurrence of a failure in a memory block based on a plurality of test data signals outputted from the memory block, and store an address corresponding to the memory block determined to have failed as a repair address; and an anti-fuse circuit configured to receive the repair address from the repair address detection circuit, and to electrically program the repair address to store a programmed address.

In another embodiment of the present invention, a repair circuit of a semiconductor memory apparatus includes: a test data processing block configured to output a failure detection signal by logically combining a plurality of test data signals outputted from a memory block under the control of a self-address rupture signal; a store pulse signal generation unit configured to generate a store pulse signal selectively activated in response to the failure detection signal, the self-address rupture signal, and an external address rupture signal; a repair address latch unit configured to store the address corresponding to the memory block in response to the store pulse signal; and an anti-fuse circuit configured to selectively program one of repair addresses stored in the repair address latch unit and addresses inputted from the outside in response to the external address rupture signal during an activation period of a rupture enable signal.

In yet another embodiment of the present invention, a method of repairing a semiconductor memory apparatus includes the steps of: determining an occurrence of a failure in a memory block by logically combining a plurality of test data signals outputted from the memory block; storing an address corresponding to the memory block determined to have failed; electrically programming the stored address to an anti-fuse set; and comparing the address programmed to the anti-fuse set with input addresses and replacing the memory block with a redundancy memory block based on a result of the comparison.

In yet another embodiment of the present invention, a semiconductor memory apparatus includes a repair circuit, and the repair circuit comprises: a repair address detection unit that determines an occurrence of a defect in a memory block based on a plurality of test data signals outputted from the memory block, and latches an address corresponding to the memory block determined to be defective as a repair address; and a repair address storage unit that receives the repair address from the repair address detection unit, and stores the repair address as a programmed address by changing its electrical state.

BRIEF DESCRIPTION OF THE DRAWINGS

Features, aspects, and embodiments are described in conjunction with the attached drawings, in which.

DETAILED DESCRIPTION

Hereinafter, a repair circuit and repair method of a semiconductor memory apparatus according to the present invention will be described below with reference to the accompanying drawings through exemplary embodiments.

For reference, since terms, symbols and signs that are used in drawings and in this detailed description to designate devices, blocks, and so on may be used for detailed units as needed, it is to be noted that the same terms, symbols and signs may not designate the same devices, blocks, and so on in the entire circuitry. In general, the logic signals of a circuit and binary data values are categorized into a high level (H) or a low level (L) in correspondence to voltage levels, and may be represented as '1' or '0', respectively. Furthermore, as needed, a high impedance state (a high-Z state) may be additionally defined and described.

Figure 1:
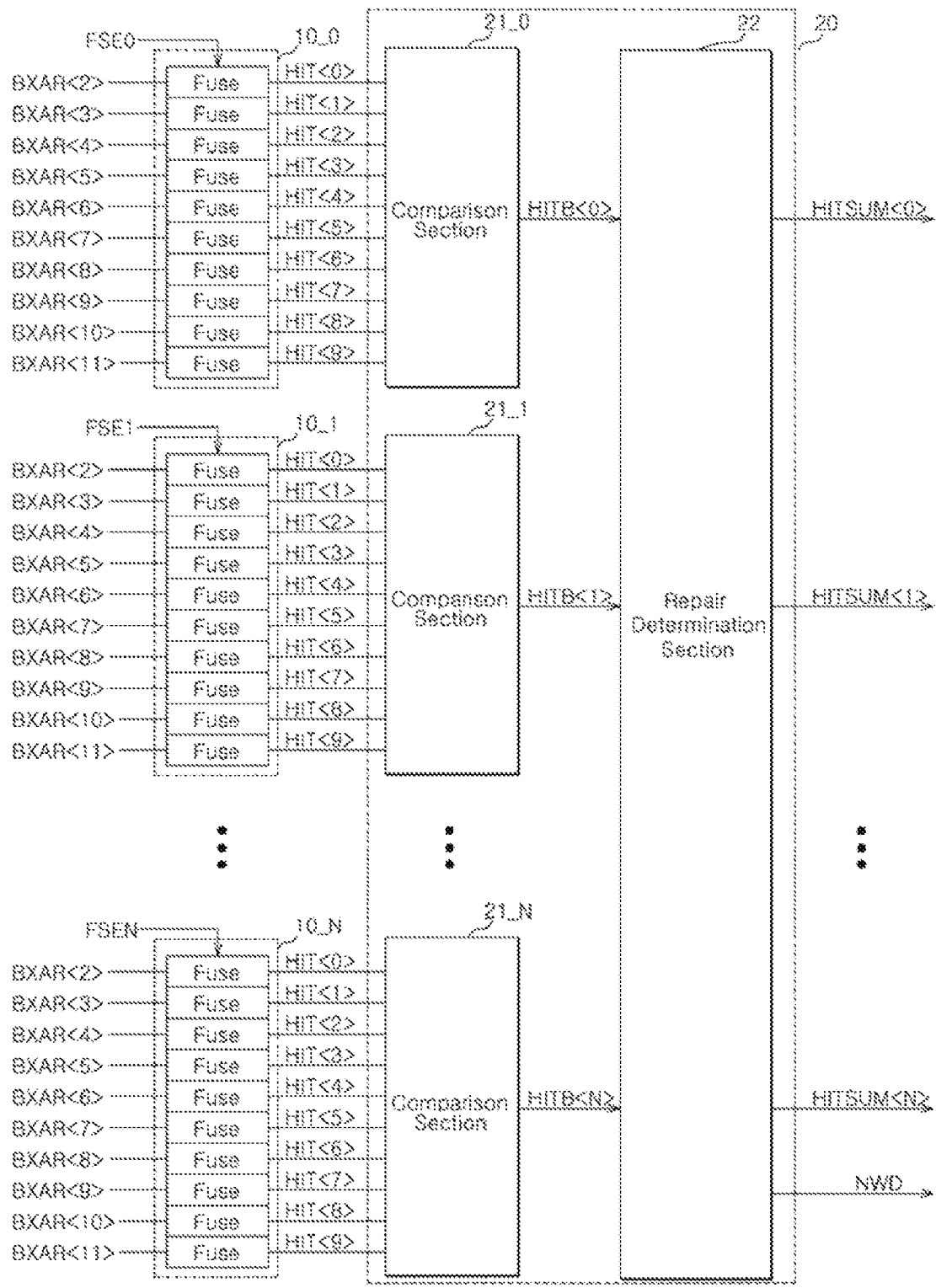
FIG. 1 is a configuration diagram illustrating a repair circuit of a typical semiconductor memory apparatus.
Figure 2:
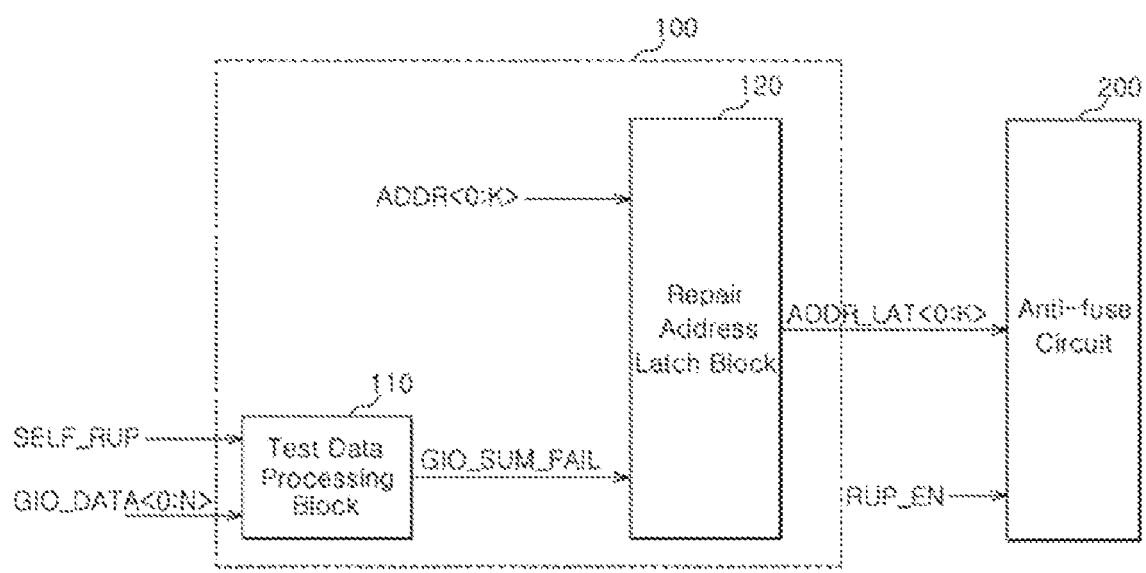
FIG. 2 is a configuration diagram illustrating a repair circuit of a semiconductor memory apparatus according to one embodiment.

FIG. 2 is a configuration diagram illustrating a repair circuit of a semiconductor memory apparatus according to one embodiment of the invention.

The repair circuit of a semiconductor memory apparatus according to this embodiment includes only a simplified configuration, for the sake of clear description of the technical principles offered by the embodiment.

Referring to FIG. 2, the repair circuit of a semiconductor memory apparatus includes a repair address detection circuit 100 and an anti-fuse circuit 200.

The repair address detection circuit 100 is configured to determine the occurrence of a failure in a memory block based on a plurality of test data signals GIO_DATA<0:N> outputted from the memory block, and store an address corresponding to the memory block determined to have failed. The plurality of test data signals GIO_DATA<0:N> are outputted in a compressed test mode. For reference, a compressed test is used to reduce the testing time. The compressed test is performed through a write operation of the same data on a plurality of memory cells, and compressing and outputting the data of the plurality of memory cells at the time of a read operation.

The repair address detection circuit 100 includes a test data processing block 110 and a repair address latch block 120. When a self-address rupture signal SELF_RUP is activated, the test data processing block 110 outputs a failure detection signal GIO_SUM_FAIL by logically combining the plurality of test data signals GIO_DATA<0:N>. In general, the test data processing block 110 includes a logic unit configured to output the failure detection signal GIO_SUM_FAIL by performing an AND or a NAND operation on the plurality of test data signals GIO_DATA<0:N>. Accordingly, when not all of the plurality of test data signals GIO_DATA<0:N> have the same data value, the corresponding memory block is determined to have failed and the failure detection signal GIO_SUM_FAIL is activated. For reference, the self-address rupture signal SELF_RUP may be defined as a signal outputted from a mode register set (MRS) or a signal outputted from an internal command block. Furthermore, according to another embodiment, the self-address rupture signal SELF_RUP may also be defined as a signal directly inputted from the outside.

The repair address latch block 120 is configured to store the address corresponding to the memory block determined to have failed in response to the failure detection signal GIO_SUM_FAIL. The repair address latch block 120 may typically include a switching unit, which selectively outputs an address ADDR<0:K> inputted under the control of the failure detection signal GIO_SUM_FAIL, and a latch unit which stores signals outputted from the switching unit. When the plurality of test data signals GIO_DATA<0:N> are outputted, the address ADDR<0:K> inputted to the repair address latch block 120 correspond to the address of the memory block that stores the plurality of test data signals GIO_DATA<0:N>. Accordingly, when the failure detection signal GIO_SUM_FAIL is activated and the memory block is determined to have failed, the address of the corresponding memory block is stored in the repair address latch block 120.

The anti-fuse circuit 200 is configured to electrically program a repair address ADDR_LAT<0:K> stored in the repair address latch block 120 of the repair address detection circuit 100, when a rupture enable signal RUP_EN is activated. That is, the anti-fuse circuit 200 is configured to perform a programming operation of changing the electrical connection state of each anti-fuse by applying an over-current or a high voltage to the set of anti-fuses included in the anti-fuse circuit 200.

As described above, in the scheme in which the occurrence of a failure in the memory block is determined based on the plurality of test data signals outputted from the memory block, the address corresponding to the memory block determined to have failed is stored, and the stored address is programmed to the anti-fuse circuit. Here, the repair address programming operation may be performed efficiently, because the address corresponding to the failed memory block may be efficiently identified through the compressed test.

For reference, the embodiment of FIG. 2 shows an example of processing the plurality of test data signals GIO_DATA<0:N> outputted from one memory block, for the purpose of clearly describing the technical principles of the embodiment. However, another embodiment is also possible, in which a number of repair addresses are stored by simultaneously processing test data signals outputted from a plurality of memory blocks, by applying the technical principles of the present invention.

Figure 3:
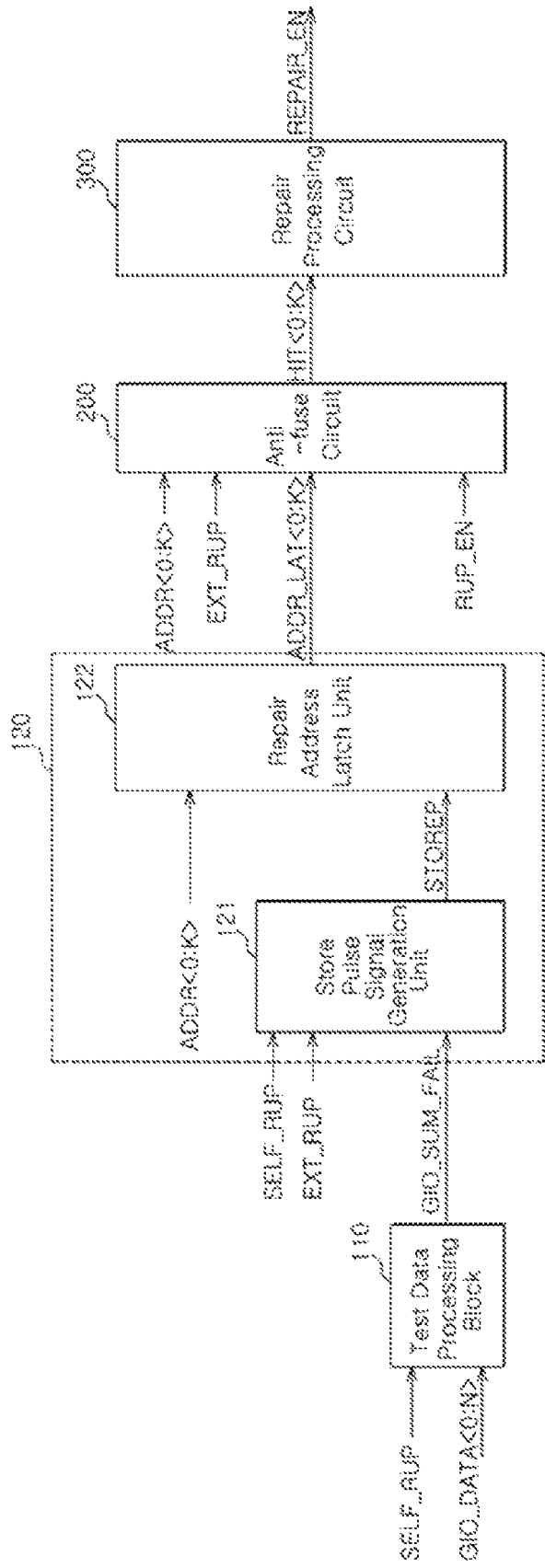
FIG. 3 is a detailed diagram illustrating the repair circuit of a semiconductor memory apparatus shown in FIG. 2.

FIG. 3 is a detailed diagram illustrating the repair circuit of the semiconductor memory apparatus shown in FIG. 2.

The repair circuit of a semiconductor memory apparatus according to this embodiment includes only a simplified configuration for the purpose of clearly describing the technical principles offered by the embodiment.

Referring to FIG. 3, the repair circuit of a semiconductor memory apparatus includes the test data processing block 110, the repair address latch block 120, and the anti-fuse circuit 200. According to this embodiment, the repair address latch block 120 includes a store pulse signal generation unit 121 and a repair address latch unit 122. For reference, the repair circuit of a semiconductor memory apparatus in this embodiment may further include a repair processing circuit 300.

The detailed configuration and principal operations of the repair circuit of a semiconductor memory apparatus configured as mentioned above are described below.

The test data processing block 110 is configured to output the failure detection signal GIO_SUM_FAIL by logically combining the plurality of test data signals GIO_DATA<0:N> outputted from the memory block under the control of the self-address rupture signal SELF_RUP. The plurality of test data signals GIO_DATA<0:N> are outputted in the compressed test mode. For reference, the compressed test is used to reduce the testing time. The compressed test is conducted by performing a write operation of the same data on the plurality of memory cells and compressing and outputting the data of the plurality of memory cells at the time of the read operation. When the self-address rupture signal SELF_RUP is activated, the test data processing block 110 outputs the failure detection signal GIO_SUM_FAIL by logically combining the plurality of test data signals GIO_DATA<0:N>.

Figure 4:
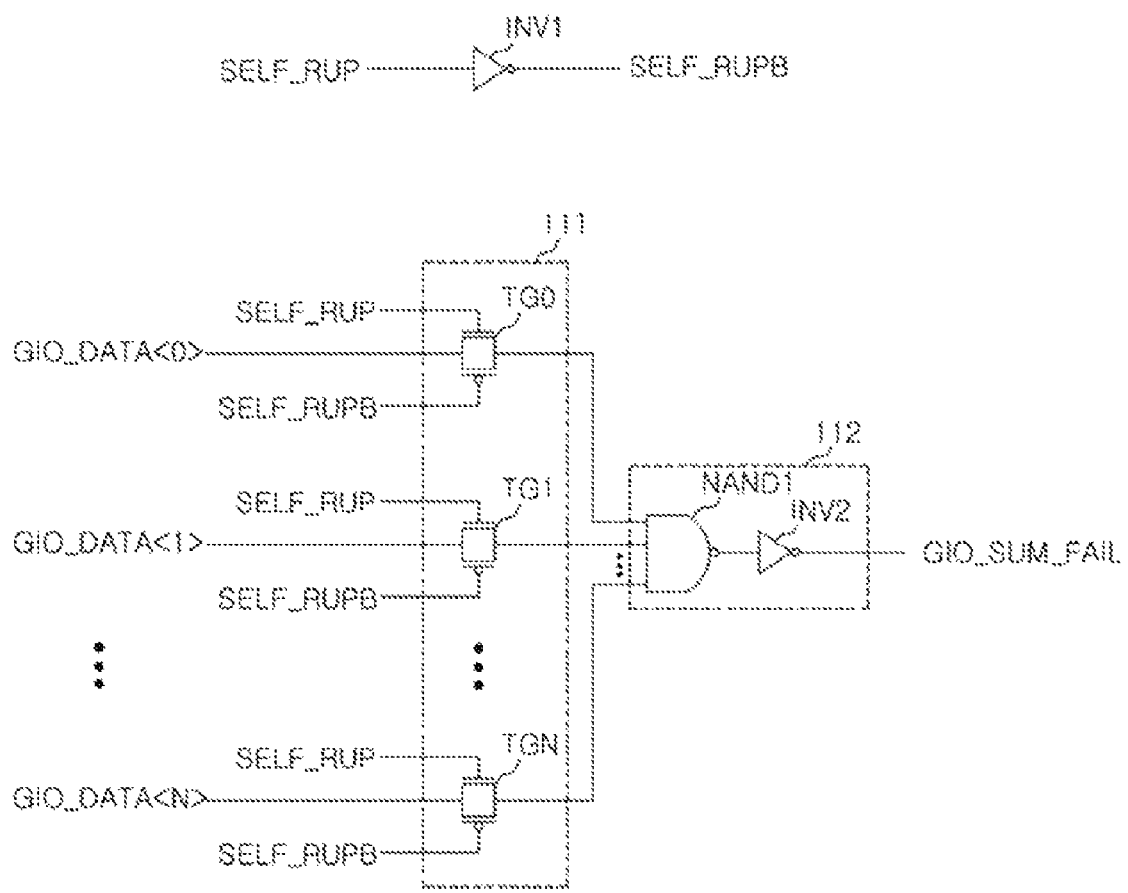
FIG. 4 is a circuit diagram illustrating the test data processing block shown in FIG. 3.

FIG. 4 is a circuit diagram illustrating the test data processing block shown in FIG. 3.

Referring to FIG. 4, the test data processing block 110 includes a switching unit 111 and a logic unit 112.

The switching unit 111 is configured to selectively output the plurality of test data signals GIO_DATA<0:N> under the control of the self-address rupture signal SELF_RUP. In this embodiment, the switching unit 111 includes a plurality of transmission gates TG0 to TGN.

The logic unit 112 is configured to output the failure detection signal GIO_SUM_FAIL by performing an AND operation on the plurality of output signals outputted from the switching unit 111. In this embodiment, the logic unit 112 includes a NAND gate NAND1 and an inverter INV2. Accordingly, when not all of the plurality of test data signals GIO_DATA<0:N> have the same data value, the corresponding memory block is determined to have failed and the failure detection signal GIO_SUM_FAIL is activated. For example, when all of the plurality of test data signals GIO_DATA<0:N> are at a high level, the failure detection signal GIO_SUM_FAIL is outputted at a high level. The fact that the failure detection signal GIO_SUM_FAIL is outputted at the high level means that the corresponding memory block outputting the plurality of test data signals GIO_DATA<0:N> is in a normal operation. On the other hand, when any one of the plurality of test data signals GIO_DATA<0:N> has a different value, the failure detection signal GIO_SUM_FAIL is outputted at a low level. The fact that the failure detection signal GIO_SUM_FAIL is outputted at the low level means that the corresponding memory block outputting the plurality of test data signals GIO_DATA<0:N> has failed.

The store pulse signal generation unit 121 is configured to output a store pulse signal STOREP selectively activated in response to the failure detection signal GIO_SUM_FAIL, the self-address rupture signal SELF_RUP, and an external address rupture signal EXT_RUP. The store pulse signal STOREP is activated when the is failure detection signal GIO_SUM_FAIL and the self-address rupture signal SELF_RUP are simultaneously activated, and deactivated when the external address rupture signal EXT_RUP is activated. For reference, the self-address rupture signal SELF_RUP and the external address rupture signal EXT_RUP may be defined as signals outputted from the mode register set (MRS) or signals outputted from the internal command block. Furthermore, according to another embodiment, the self-address rupture signal SELF_RUP and the external address rupture signal EXT_RUP may also be defined as signals inputted directly from the outside.

Figure 5:
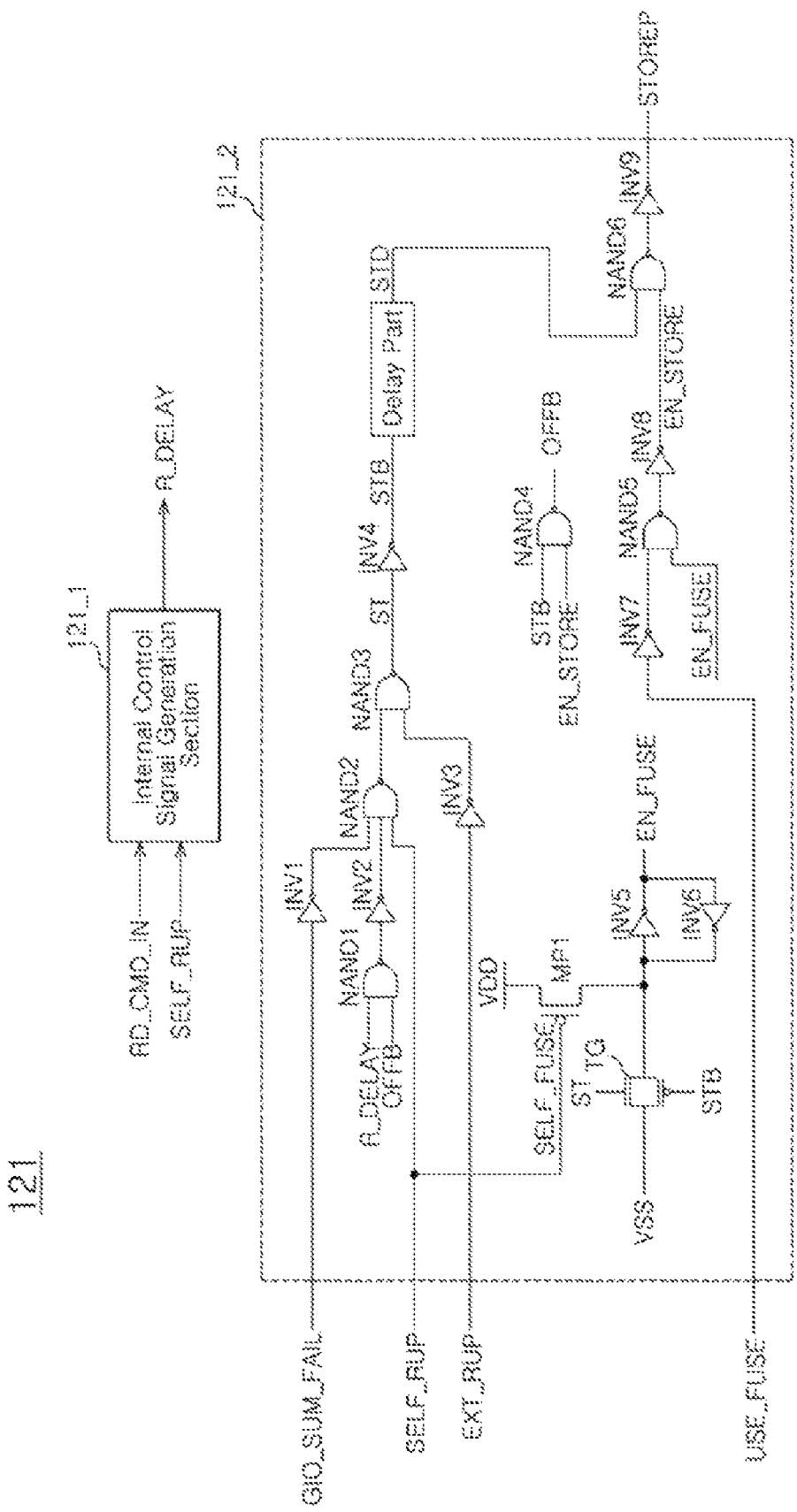
FIG. 5 is a circuit diagram illustrating the store pulse signal generation unit shown in FIG. 3.

FIG. 5 is a circuit diagram illustrating the store pulse signal generation unit shown in FIG. 3.

Referring to FIG. 5, the store pulse signal generation unit 121 includes an internal control signal generation section 121_1 and a pulse signal output section 121_2.

The internal control signal generation section 121_1 is configured to generate an internal control signal R_DELAY activated after the activation time point of a test data read signal RD_CMD_IN, in response to the self-address rupture signal SELF_RUP. The internal control signal generation section 121_1 may include a delay unit configured to delay the test data read signal RD_CMD_IN under the control of the self-address rupture signal SELF_RUP.

The pulse signal output section 121_2 is configured to output the store pulse signal STOREP activated in correspondence with the activation period of the Internal control signal R_DELAY in response to the failure detection signal GIO_SUM_FAIL, the self-address rupture signal SELF_RUP, and the external address rupture signal EXT_RUP. For reference, a fuse signal USE_FUSE is activated when a specifically configured fuse is cut, and is a general signal representing whether a specific internal block is used.

Figure 6:
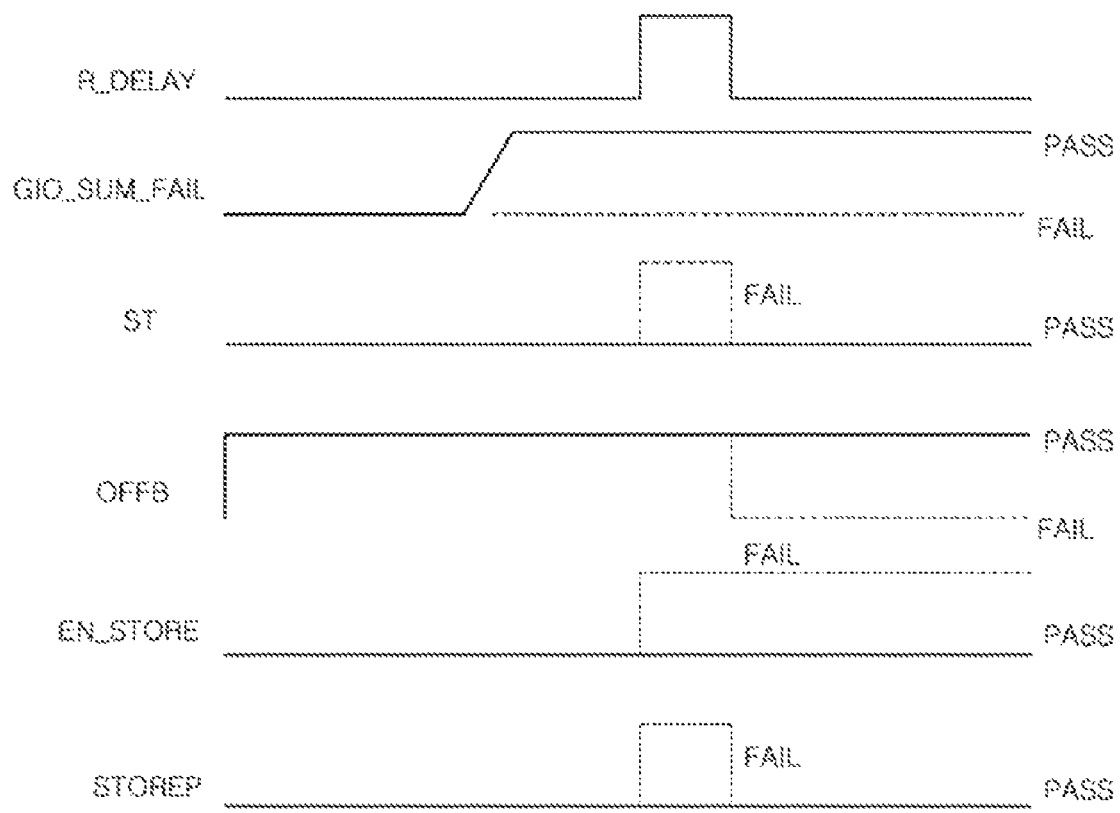
FIG. 6 is a timing diagram illustrating the internal operation of a store pulse signal generation unit.

FIG. 6 is a timing diagram illustrating the internal operation of the store pulse signal generation unit.

The operation of the store pulse signal generation unit 121 configured as mentioned above is described below with reference to the timing diagram of FIG. 6 and FIG. 5.

When the test data read signal RD_CMD_IN, which gives instructions for the output of the plurality of test data signals GIO_DATA<0:N>, and the self-address rupture signal SELF_RUP are activated, the internal control signal R_DELAY transits to a high level.

At this time, if the failure detection signal GIO_SUM_FAIL is activated to a low level, a first internal signal ST transits to a high level, a second internal signal OFFB changes to a low level, and a third internal signal EN_STORE changes to a high level. Consequently, the finally outputted store pulse signal STOREP is activated at a high level.

As a result, the store pulse signal STOREP is activated at a high level when the self-address rupture signal SELF_RUP and the failure detection signal GIO_SUM_FAIL are activated.

For reference, the dotted lines in the timing diagram of FIG. 6 indicate the internal operation of the store pulse signal generation is unit 121 when it is determined that the memory block has failed, and the solid lines in the timing diagram indicate the internal operation of the store pulse signal generation unit 121 when it is determined that the memory block is normal.

The repair address latch unit 122 is configured to store the address corresponding to the memory block in response to the store pulse signal STOREP.

Figure 7:
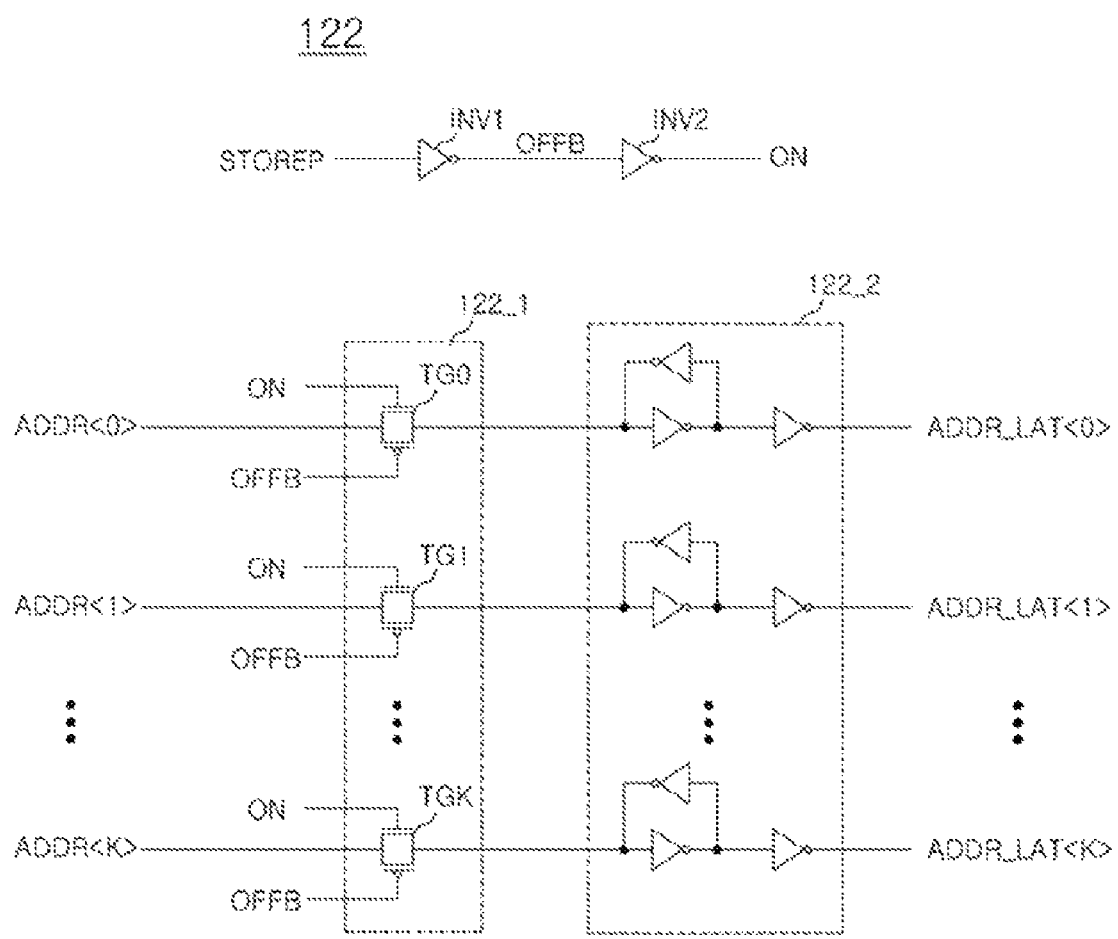
FIG. 7 is a circuit diagram illustrating the repair address latch unit shown in FIG. 3.

FIG. 7 is a circuit diagram illustrating the repair address latch unit shown in FIG. 3.

Referring to FIG. 7, the repair address latch unit 122 includes a switching section 122_1 and a latch section 122_2.

The switching section 122_1 is configured to selectively output the address ADDR<0:K> inputted under the control of the store pulse signal STOREP, and the latch section 122_2 is configured to store the signals outputted from the switching section 122_1.

The repair address latch unit 122 is configured to store the address corresponding to the memory block determined to have failed. When the plurality of test data signals GIO_DATA<0:N> are outputted, the address ADDR<0:K> inputted to the repair address latch unit 122 correspond to the address of the memory block that stores the plurality of test data signals GIO_DATA<0:N>. Consequently, the activation of the store pulse signal STOREP represents that the memory block has been determined to have failed, and the address of the corresponding memory block is stored in the latch section 122_2 of the repair address latch unit 122.

The anti-fuse circuit 200 is configured to selectively program a repair address ADDR_LAT<0:K> stored in the repair address latch unit 122 or the address ADDR<0:K> inputted from the outside, in response to the external address rupture signal EXT_RUP during the activation period of the rupture enable signal RUP_EN. That is, the anti-fuse circuit 200 is configured to perform the programming operation of changing the electrical connection state of each anti-fuse by applying an over-current or a high voltage to the anti-fuse sets included in the anti-fuse circuit 200. For reference, the rupture enable signal RUP_EN gives instructions for the programming operation of the fuse sets, and may be defined as a signal outputted from the mode register set (MRS) or a repair-related control circuit.

When the rupture enable signal RUP_EN and the external address rupture signal EXT_RUP are activated, the anti-fuse circuit 200 electrically programs the address ADDR<0:K> inputted from the outside. Furthermore, when the external address rupture signal EXT_RUP is deactivated, the anti-fuse circuit 200 electrically programs the repair address ADDR_LAT<0:K> stored in the repair address latch unit 122.

As described above, in the scheme in which the occurrence of a failure in the memory block is determined based on the plurality of test data signals outputted from the memory block, the address corresponding to the memory block determined to have failed is stored, and the stored address is programmed to the anti-fuse circuit, the repair address programming operation can be performed efficiently, because the address corresponding to the failed memory block may be efficiently identified through the compressed test. Furthermore, it is also possible to directly input repair addresses to the fuse sets from the outside as needed. Furthermore, while the present invention has been described with regard to using anti-fuses, fuses rather than anti-fuses may be equally used for the anti-fuse circuit 200 to implement the present invention.

For reference, the embodiment in FIG. 3 shows an example in which the plurality of test data signals GIO_DATA<0:N> are outputted from one memory block for the purpose of clearly describing the technical principle of the embodiment. However, another embodiment may be possible, in which many repair addresses are stored by simultaneously processing test data signals outputted from a plurality of memory blocks, by applying the technical principle of the present invention.

Assuming that specific repair addresses are programmed to the anti-fuse set included in the anti-fuse circuit 200, the operations after the repair addresses are programmed to the anti-fuse circuit 200 are as follows.

The anti-fuse circuit 200 is configured to output a plurality of hit signals HIT<0:9> by comparing the programmed address with the input address ADDR<0:K>.

The repair processing circuit 300 is configured to enable a redundancy memory block based on the plurality of hit signals HIT<0:9> outputted from the anti-fuse circuit 200. At this time, is access to the memory block determined to have failed is prohibited.

As described above, the semiconductor memory apparatus is repaired through the steps of detecting the occurrence of a failure in the memory block by logically combining the plurality of test data signals outputted from the memory block, storing the address corresponding to the memory block determined to have failed, electrically programming the stored address to the anti-fuse set, and comparing the address programmed to the anti-fuse set with the input address and replacing the memory block with the redundancy memory block based on the result of the comparison.

In other words, repair addresses may be efficiently programmed through the repair circuit and repair method of the semiconductor memory apparatus.

So far, embodiments of the present invention have been described in detail. For reference, embodiments including additional component elements, which are not directly associated with the technical principle of the present invention, may be exemplified in order to describe the present invention in further detail. Moreover, the active high and active low configuration for indicating the activated states of signals and circuits may vary depending upon the embodiment. Since the details of all the various embodiments are too numerous to mention and can be easily inferred by those skilled in the art, they are not enumerated herein.

While certain embodiments have been described above, it will be understood by those skilled in the art that the embodiments described are by way of example only. Accordingly, the repair circuit and the repair method of a semiconductor memory apparatus described herein should not be limited based on the described embodiments. Rather, the repair circuit and the repair method of a semiconductor memory apparatus described herein should only be limited in light of the claims that follow when taken in conjunction with the above description and accompanying drawings.

What is claimed is:

1. A semiconductor memory apparatus including a repair circuit, the repair circuit comprising:
a repair address detection circuit configured to determine an occurrence of a failure in a memory block based on a plurality of test data signals outputted from the memory block, and store an address corresponding to the memory block determined to have failed as a repair address, wherein the repair address detection circuit comprises:
  a test data processing block comprising a logic unit configured to output the failure detection signal by performing an AND operation on the plurality of test data signals, wherein the test data processing block is configured to output a failure detection signal by logically combining the plurality of test data signals; and
  a repair address latch block configured to store the repair address corresponding to the memory block in response to the failure detection signal; and
  an anti-fuse circuit configured to receive the repair address from the repair address detection circuit, and to electrically program the repair address to store a programmed address.

2. The semiconductor memory apparatus according to claim 1, wherein the anti-fuse circuit is configured to compare the programmed address with an input address and to output a result of the comparison.

3. The semiconductor memory apparatus according to claim 1, wherein the plurality of test data signals are outputted in a compressed test mode.

4. The semiconductor memory apparatus according to claim 1, wherein the repair address latch block comprises:
  a switching unit configured to selectively output an address inputted under the control of the failure detection signal; and
  a latch unit configured to store signals outputted from the switching unit.

5. A repair circuit of a semiconductor memory apparatus, comprising:
  a test data processing block configured to output a failure detection signal by logically combining a plurality of test data signals outputted from a memory block under the control of a self-address rupture signal;
  a store pulse signal generation unit configured to generate a store pulse signal selectively activated in response to the failure detection signal, the self-address rupture signal, and an external address rupture signal;
  a repair address latch unit configured to store the address corresponding to the memory block in response to the store pulse signal; and
  an anti-fuse circuit configured to selectively program one of repair addresses stored in the repair address latch unit and addresses inputted from the outside in response to the external address rupture signal during an activation period of a rupture enable signal.

6. The repair circuit of a semiconductor memory apparatus according to claim 5, wherein the anti-fuse circuit is configured to compare the programmed addresses with input addresses and output a result of the comparison.

7. The repair circuit of a semiconductor memory apparatus according to claim 6, further comprising:
  a repair processing circuit configured to enable a redundancy memory block based on a plurality of hit signals outputted from the anti-fuse circuit.

8. The repair circuit of a semiconductor memory apparatus according to claim 5, wherein the anti-fuse circuit is configured to program addresses by using an electrical method.

9. The repair circuit of a semiconductor memory apparatus according to claim 5, wherein the plurality of test data signals are outputted in a compressed test mode.

10. The repair circuit of a semiconductor memory apparatus according to claim 5, wherein the test, data processing block comprises:

a switching unit configured to selectively output the plurality of test data signals under the control of the self-address rupture signal; and
  a logic unit configured to output the failure detection signal by performing an AND operation on a plurality of output signals outputted from the switching unit.

11. The repair circuit of a semiconductor memory apparatus according to claim 5, wherein the store pulse signal is activated when the failure detection signal and the self-address rupture signal are activated, and is deactivated when the external address rupture signal is activated.

12. The repair circuit of a semiconductor memory apparatus according to claim 5, wherein the store pulse signal generation unit comprises:
  an internal control signal generation section configured to generate an internal control signal activated after an activation time point of a test data read signal in response to the self-address rupture signal; and
  a pulse signal output section configured to output the store pulse signal activated in correspondence with an activation period of the internal control signal in response to the failure detection signal, the self-address rupture signal, and the external address rupture signal.

13. The repair circuit of a semiconductor memory apparatus according to claim 12, wherein the internal control signal generation section comprises a delay part configured to delay the test data read signal under the control of the self-address rupture signal.

14. The repair circuit of a semiconductor memory apparatus according to claim 5, wherein the repair address latch unit comprises:
  a switching section configured to selectively output addresses inputted under the control of the store pulse signal; and
  a latch section configured to store signals outputted from the switching section.

15. A method of repairing a semiconductor memory apparatus, comprising:
  determining an occurrence of a failure in a memory block by logically combining a plurality of test data signals outputted from the memory block and determining whether all of the plurality of test data signals have the same data value;
  storing an address corresponding to the memory block determined to have failed;
  electrically programming the stored address to an anti-fuse set; and
  comparing the address programmed to the anti-fuse set with input addresses and replacing the memory block with a redundancy memory block based on a result of the comparison
  wherein, in the step of determining the occurrence of a failure in the memory block, it is determined whether all of the plurality of test data signals have the same data value.

16. The method of a semiconductor memory apparatus according to claim 15, wherein the plurality of test data signals are outputted in a compressed test mode.

17. A semiconductor memory apparatus including a repair circuit, the repair circuit comprising:
  a repair address detection unit that determines an occurrence of a defect in a memory block based on a plurality of test data signals outputted from the memory block, and latches an address corresponding to the memory block determined to be defective as a repair address, wherein the repair address detection unit comprises:

a test data processing block that outputs a defect detection signal by performing logical AND operation on the plurality of test data signals; and a repair address latch block that stores the repair address corresponding to the memory block as the programmed address in response to the defect detection signal; and a repair address storage unit that receives the repair address from the repair address detection unit, and stores the repair address as a programmed address by changing its electrical state.

18. The semiconductor memory apparatus according to claim 17, wherein the repair address storage unit compares the programmed address with an input address to output a result of the comparison.

19. The semiconductor memory apparatus according to claim 17, wherein the plurality of test data signals are outputted in a compressed test mode.

20. The semiconductor memory apparatus according to claim 17, wherein the repair address storage unit comprises a plurality of anti-fuses.

21. The semiconductor memory apparatus according to claim 17, wherein the repair address storage unit comprises a plurality of fuses.

* * * * *